(12) United States Patent
Kim et al.

(10) Patent No.: US 9,419,063 B2
(45) Date of Patent: Aug. 16, 2016

(54) ORGANIC LIGHT EMITTING DIODE DISPLAY HAVING HIGH APERTURE RATIO AND METHOD FOR MANUFACTURING THE SAME

(71) Applicant: LG Display Co., Ltd., Seoul (KR)

(72) Inventors: Jaeil Kim, Seoul (KR); Hojin Ryu, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/581,873

(22) Filed: Dec. 23, 2014

(65) Prior Publication Data

US 2016/0071916 A1 Mar. 10, 2016

(30) Foreign Application Priority Data

Sep. 5, 2014 (KR) .................. 10-2014-0119390

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 27/32* | (2006.01) |

(52) U.S. Cl.
CPC ........ *H01L 27/3248* (2013.01); *H01L 27/3265* (2013.01); *H01L 2227/323* (2013.01)

(58) Field of Classification Search
CPC ............................ H01L 27/1214; H01L 27/12
USPC ...................................... 257/72; 438/23, 618
See application file for complete search history.

(56) References Cited

U.S. PATENT DOCUMENTS

| | | | | |
|---|---|---|---|---|
| 2004/0100202 A1* | 5/2004 | Koyama | ............... | H01L 27/1255 315/169.3 |
| 2004/0251953 A1* | 12/2004 | Yamazaki | ............ | G09G 3/3233 327/512 |
| 2006/0145606 A1* | 7/2006 | Lee | ...................... | H01L 27/3276 313/509 |
| 2011/0090191 A1* | 4/2011 | Lee | ...................... | H01L 27/1214 345/206 |
| 2011/0108840 A1* | 5/2011 | Lee | ...................... | H01L 27/1214 257/59 |
| 2011/0133215 A1* | 6/2011 | Kang | .................. | H01L 27/3279 257/88 |
| 2013/0044095 A1* | 2/2013 | Heo | ..................... | H01L 27/3276 345/211 |
| 2013/0069067 A1* | 3/2013 | Youn | ................... | H01L 27/3279 257/59 |
| 2013/0193456 A1* | 8/2013 | Lee | ..................... | H01L 27/3213 257/88 |

* cited by examiner

*Primary Examiner* — Jami M Valentine
(74) *Attorney, Agent, or Firm* — Fenwick & West LLP

(57) ABSTRACT

An organic light emitting diode (OLED) display includes a substrate in which an emission area and a non-emission area are defined, an OLED disposed in the emission area. The OLED display further includes a thin film transistor disposed in the non-emission area, a first insulation layer overlapping the thin film transistor in the non-emission area, a first storage capacitance electrode disposed in the emission area on the first insulation layer, a second insulation layer disposed to cover the first storage capacitance electrode and the thin film transistor except a portion of the thin film transistor, said portion of the thin film transistor being exposed through the second insulation later. The OLED display further includes an organic protective layer disposed on the second insulation layer, and an anode electrode of the OLED disposed on the second insulation layer, the anode electrode electrically connected to the thin film transistor.

12 Claims, 14 Drawing Sheets

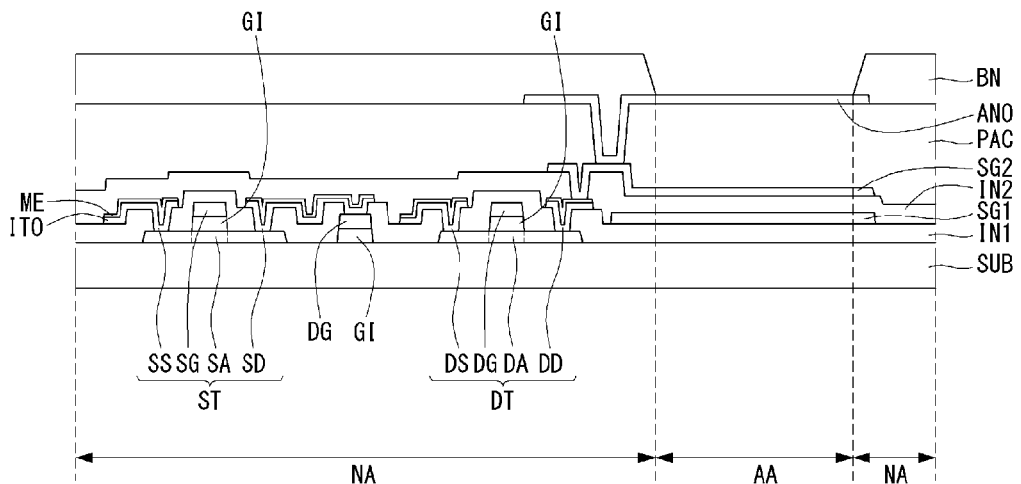
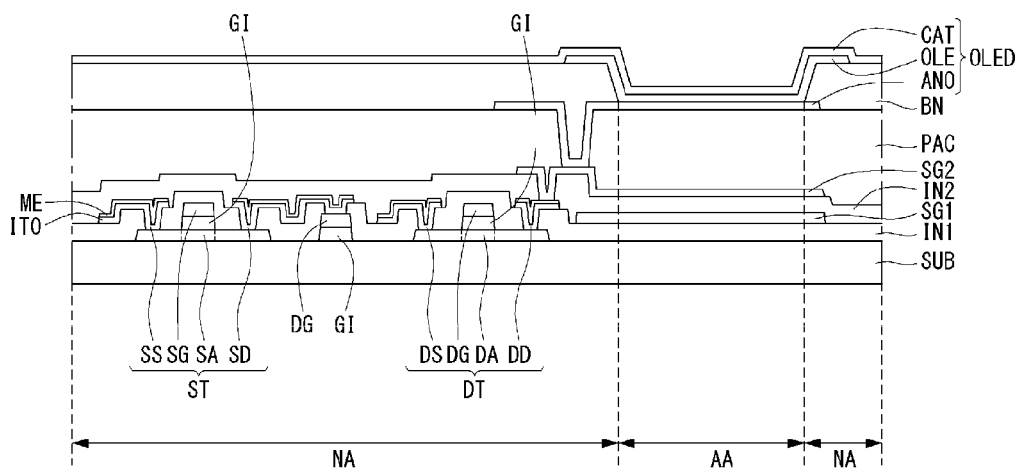

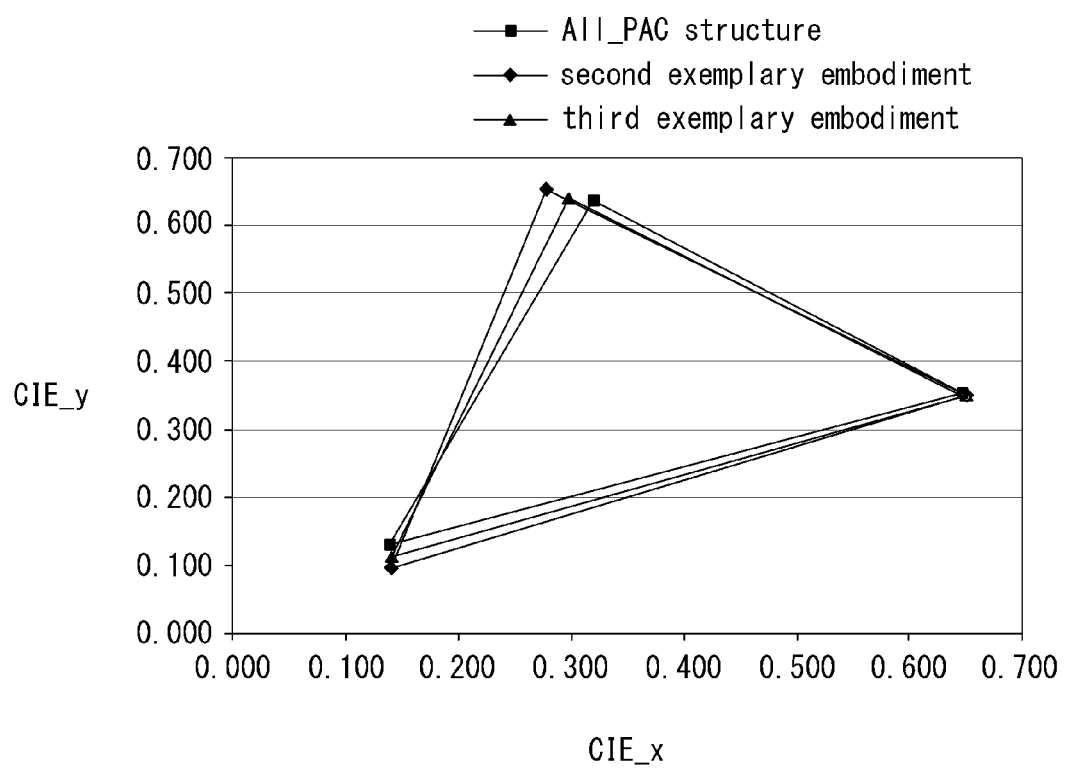

ORGANIC LIGHT EMITTING DIODE DISPLAY HAVING HIGH APERTURE RATIO AND METHOD FOR MANUFACTURING THE SAME

This application claims the priority benefit of Korean Patent Application No. 10-2014-0119390 filed on Sep. 5, 2014, which is incorporated herein by reference for all purposes as if fully set forth herein.

BACKGROUND

1. Technical Field

This disclosure relates to an organic light emitting diode display and a method for manufacturing the same, which can improve an aperture ratio by forming a storage capacitance using a transparent conductive material.

2. Discussion of the Related Art

Recently, there have been developed various types of flat panel displays capable of reducing the weight and volume of cathode ray tubes, which are disadvantages. The flat panel displays include a liquid crystal display (LCD), a field emission display (FED), a plasma display panel (PDP), an electroluminescence (EL) device, and the like.

EL devices are classified into inorganic EL devices and organic light emitting diode displays according to materials of emission layers. The EL devices are self-emitting devices and have advantages of a fast response speed, high emission efficiency and luminance, and wide viewing angles.

FIG. 1 illustrates the structure of an organic light emitting diode. The organic light emitting diode, as shown in FIG. 1, includes an organic EL compound layer, and cathode and anode electrodes Cathode and Anode opposite to each other with the organic EL compound layer interposed therebetween. The organic EL compound layer includes a hole injection layer HIL, a hole transport layer HTL, an emission layer EML, an electron transport layer ETL, and an electron injection layer EIL.

In the organic light emitting diode, excitons are formed in an excitation process when holes and electrons respectively injected into the anode electrode Anode and the cathode electrode Cathode are recombined in the emission layer EML, and light is emitted by energy from the excitons. An organic light emitting diode display (OLEDD) display images by electrically controlling the amount of light generated in an emission layer EML of an organic light emitting diode as shown in FIG. 1.

OLEDDs using characteristics of organic light emitting diodes that are electroluminescence elements are classified into passive matrix type organic light emitting diode displays (PMOLEDs) and active matrix type organic light emitting diode displays (AMOLEDs).

The AMOLED displays images by controlling current flowing in an organic light emitting diode using a thin film transistor (hereinafter, referred to as a "TFT").

FIG. 2 is an example of an equivalent circuit diagram showing the structure of one pixel in an OLEDD. FIG. 3 is a plan view showing the structure of one pixel in the OLEDD. FIG. 4 is a sectional view showing the structure of the OLEDD taken along line I-I' in FIG. 3.

Referring to FIGS. 2 and 3, the AMOLED includes a switching TFT ST, a driving TFT DT connected to the switching TFT ST, and an organic light emitting diode OLED contacted with the driving TFT DT.

The switching TFT ST is formed at a portion where a scan line SL and a data line DL intersect each other. The switching TFT ST has a function of selecting a pixel. The switching TFT ST includes a gate electrode SG branched from the scan line SL, a semiconductor layer SA, a source electrode SS, and a drain electrode SD. The driving TFT DT has a function of driving the organic light emitting diode OLED of the pixel selected by the switching TFT ST. The driving TFT DT includes a gate electrode DG connected to the drain electrode SD of the switching TFT ST, a semiconductor layer DA, a source electrode SD connected to a driving current line VDD, and a drain electrode DD. The drain electrode DD of the driving TFT DT is connected to an anode electrode ANO of the organic light emitting diode OLED.

More specifically, referring to FIG. 4, the gate electrodes SG and DG of the switching and driving TFTs ST and DT are formed on a substrate SUB of the AMOLED. A gate insulation layer GI covers the gate electrodes SG and DG. The semiconductor layers SA and DA are respectively formed on portions of the gate insulation layer GI, overlapped with the gate electrodes SG and DG. The source electrodes SS and DS and the drain electrodes SD and DD are formed opposite to each other at predetermined distances on the semiconductor layers SA and DA, respectively. The drain electrode SD of the switching TFT ST is contacted with the gate electrode DG of the driving TFT DT through a contact hole formed in the gate insulation layer GI. A protective layer PAS covering the switching and driving TFTs ST and DT configured as described above is coated on the entire surface of the substrate SUB.

Particularly, when the semiconductor layers SA and DA are formed of an oxide semiconductor material, the semiconductor layers SA and DA are advantageous to high resolution and high-speed driving in a large-area TFT substrate with large charging capacitance because of their high charge mobility. However, in order to secure the stability of the elements, the oxide semiconductor layers SA and DA preferably further include etch stoppers SE and DE for protection from an etchant on upper surfaces thereof, respectively.

A color filter CF is formed at a portion corresponding to the region of the anode electrode ANO to be formed later. The color filter CF is preferably formed to occupy an area as wide as possible. For example, the color filter CF is preferably formed to be overlapped with many regions of the data line DL, the driving current line VDD and a scan line SL. Since several components are formed on the substrate having the color filter CF formed thereon, the surface of the substrate is not flat, and many step coverages are formed on the substrate. Thus, an overcoat layer OC is coated on the entire surface of the substrate in order to planarize the surface of the substrate.

The anode electrode ANO of the organic light emitting diode OLED is formed on the overcoat layer OC. Here, the anode electrode ANO is connected to the drain electrode DD of the driving TFT DT through a contact hole formed in the overcoat layer OC and the protective layer PAS.

A bank BN is formed on a region in which the switching TFT ST, the driving TFT DT and the various lines DL, SL and VDD are formed, on the substrate having the anode electrode ANO formed thereon, to define a pixel.

The anode electrode ANO exposed by the bank BN becomes an emission region. An organic light emitting layer OLE and a cathode electrode layer CAT are sequentially laminated on the anode electrode ANO exposed by the bank BN. When the organic light emitting layer OLE is made of an organic material emitting white light, a color assigned to each pixel is displayed by the color filter CF positioned below the organic light emitting layer OLE. The OLEDD configured as shown in FIG. 4 becomes a bottom emission display in which light is emitted downward.

In the bottom emission OLEDD described above, a storage capacitance STG is formed in a space in which the driving TFT DT and the anode electrode ANO are overlapped with each other. The OLEDD displays image information by driving organic light emitting diodes. In this state, a considerably large amount of energy is required to drive the organic light emitting diodes. Therefore, a large-capacity storage capacitance is required to exactly display image information such as moving pictures in which data values are quickly changed.

In order to sufficiently ensure the magnitude of the storage capacitance, the area of a storage capacitance electrode should be sufficiently large. In a bottom emission OLEDD, there occurs a problem in that, if the area of a storage capacitance increases, an area emitting light, i.e., an aperture ratio decreases. In a top emission OLEDD, a storage capacitance can be formed below an emission region. Thus, although a large-capacity storage capacitance is designed, the aperture ratio does not decrease. However, in the bottom emission OLEDD, there is a problem in that the area of the storage capacitance is directly correlated with the decrease in the aperture ratio.

SUMMARY

The present embodiments provide an organic light emitting diode display and a method for manufacturing the same, in which a storage capacitance using a transparent storage capacitance electrode is formed in an emission region, so that it is possible to ensure a sufficient storage capacitance without decreasing an aperture ratio. Further, the present embodiments provide an organic light emitting diode display and a method for manufacturing the same, which can reduce the number of mask processes for forming a storage capacitance when the storage capacitance is formed in an emission region.

In one aspect, an organic light emitting diode (OLED) display comprises a substrate in which an emission area and a non-emission area are defined, an OLED disposed in the emission area, a thin film transistor disposed in the non-emission area, a first insulation layer overlapping the thin film transistor in the non-emission area, a first storage capacitance electrode disposed in the emission area on the first insulation layer. The OLED device further comprises a second insulation layer disposed to cover the first storage capacitance electrode and the thin film transistor except a portion of the thin film transistor, said portion of the thin film transistor being exposed through the second insulation layer. The device further comprises an organic protective layer disposed on the second insulation layer and overlapping with the thin film transistor except where said portion of the thin film transistor is exposed through the second insulation layer, and an anode electrode of the OLED disposed on the second insulation layer, the anode electrode electrically connected to the thin film transistor, wherein the anode electrode and the first storage capacitance electrode are overlapped with each other with the second insulation layer interposed therebetween in the emission area to form an storage capacitor.

In another aspect, there is a method for fabricating an organic light emitting diode display, the method comprises preparing a substrate including an emission area and a non-emission area, forming a thin film transistor in the non-emission area, forming a first insulation layer overlapping the thin film transistor in the non-emission area, forming a first storage capacitance electrode in the emission area on the first insulation layer. The method further comprises forming a second insulation layer overlapping the first storage capacitance electrode and the thin film transistor except a portion of the thin film transistor, forming an organic protective layer on the second insulation layer to overlap the thin film transistor except where said portion of the thin film transistor is exposed through the second insulation layer, and forming an anode electrode on the second insulation layer to be electrically connected to the thin film transistor, wherein the anode electrode and the first storage capacitance electrode are overlapped with each other with the second insulation layer interposed therebetween in the emission area to form an storage capacitor.

According to one or more embodiments, organic light emitting diode (OLED) display comprises a substrate including an emission area and a non-emission area, a thin film transistor formed in the non-emission area, an OLED formed in the emission area, and a storage capacitor coupled between a gate electrode and one of a source electrode and a drain electrode of the thin film transistor, the storage capacitor formed in at least a part of the emission area to overlap with a part of the OLED in a direction in which light is emitted by the OLED.

In one or more embodiments, the OLED display further comprises an organic protective layer separating the storage capacitor from the OLED in substantially the entire emission area, the organic protective layer including an organic insulating material.

In one or more embodiments, a method of manufacturing an organic light emitting diode (OLED) display comprises forming a substrate including an emission area and a non-emission area, forming a thin film transistor in the non-emission area of the substrate, forming a storage capacitor in the emission area, and forming an OLED in the emission area to overlap with the storage capacitor in at least a part of the emission area in a direction in which light is emitted by the OLED.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 7A to 7J are views showing a method for manufacturing the organic light emitting diode display according to the first exemplary embodiment of the present disclosure;

FIG. 11 is a graph showing color coordinates according to results of Table 1.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure.

Features of the First Exemplary Embodiment

Figure 1:
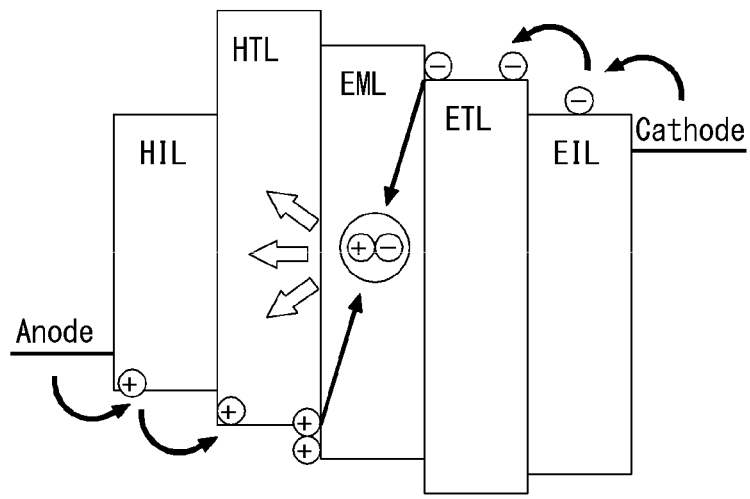
FIG. 1 is a view showing a general organic light emitting diode.
Figure 2:
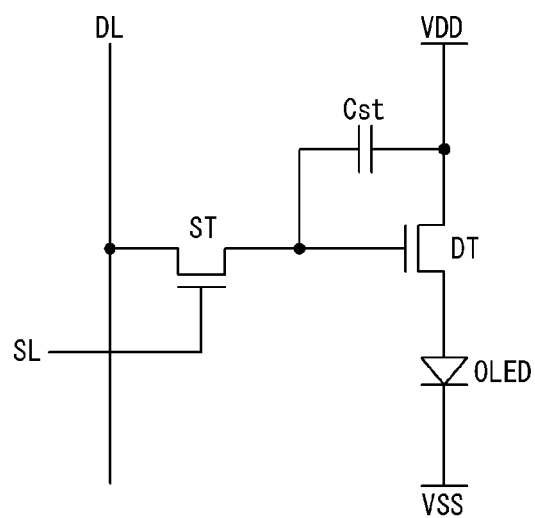
FIG. 2 is an equivalent circuit diagram showing the structure of one pixel in a general organic light emitting diode display.
Figure 3:
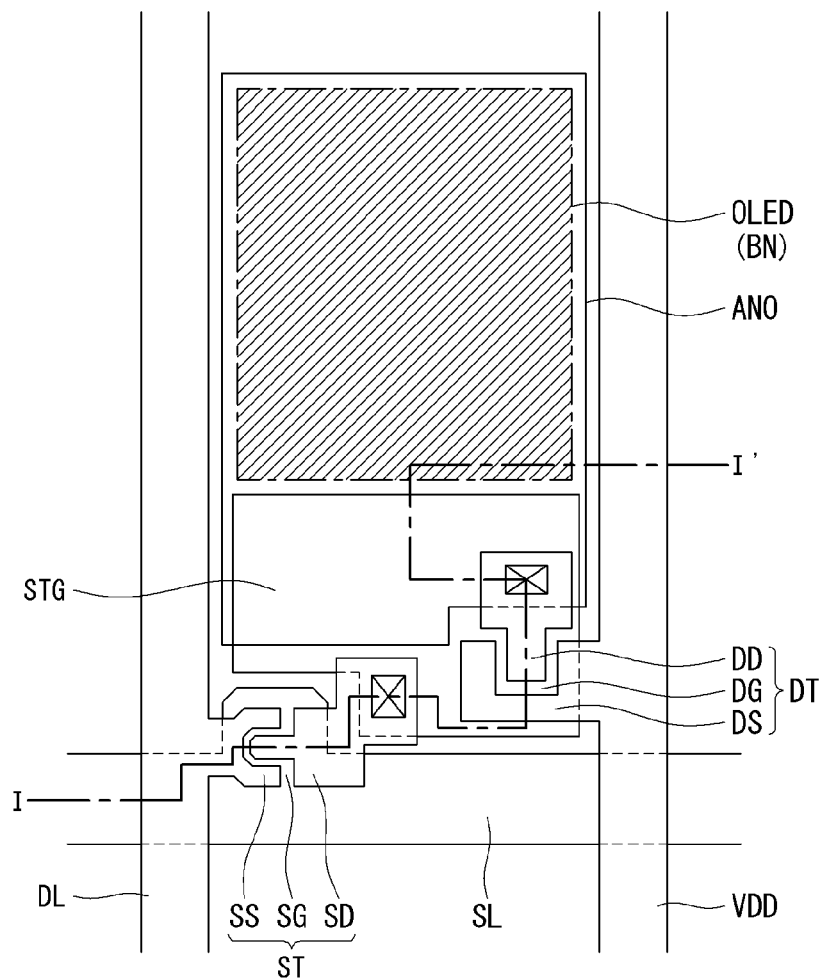
FIG. 3 is a plan view showing the structure of one pixel in the general organic light emitting diode display.
Figure 4:
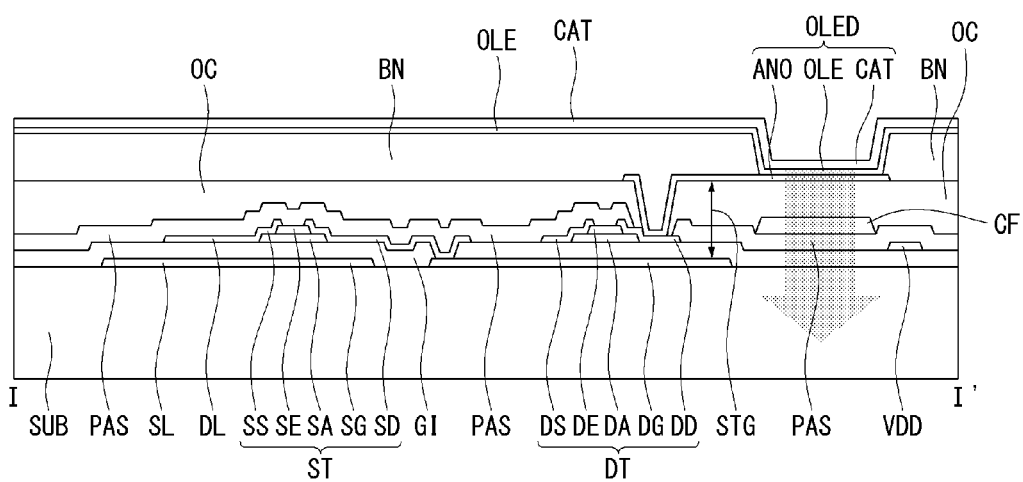
FIG. 4 is a sectional view showing the structure of the organic light emitting diode display taken along line I-I' in FIG. 3.
Figure 5:
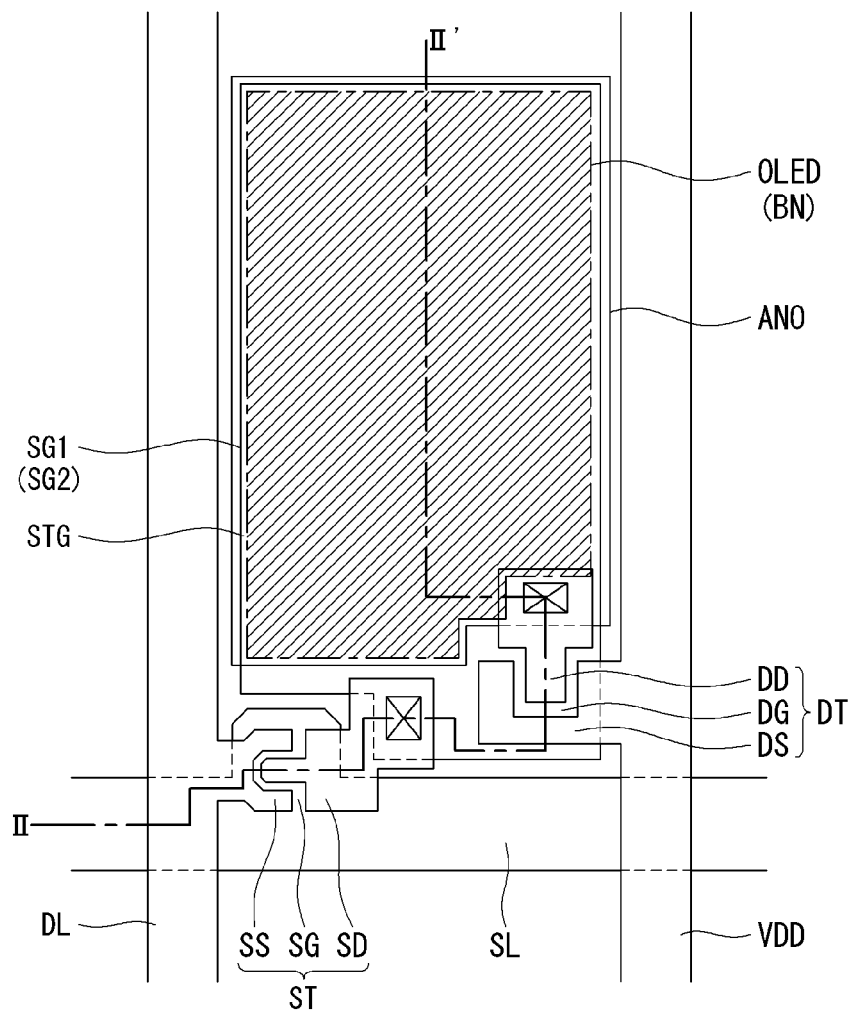
FIG. 5 is a plan view showing the structure of an organic light emitting diode display according to a first exemplary embodiment of the present disclosure.
Figure 6:
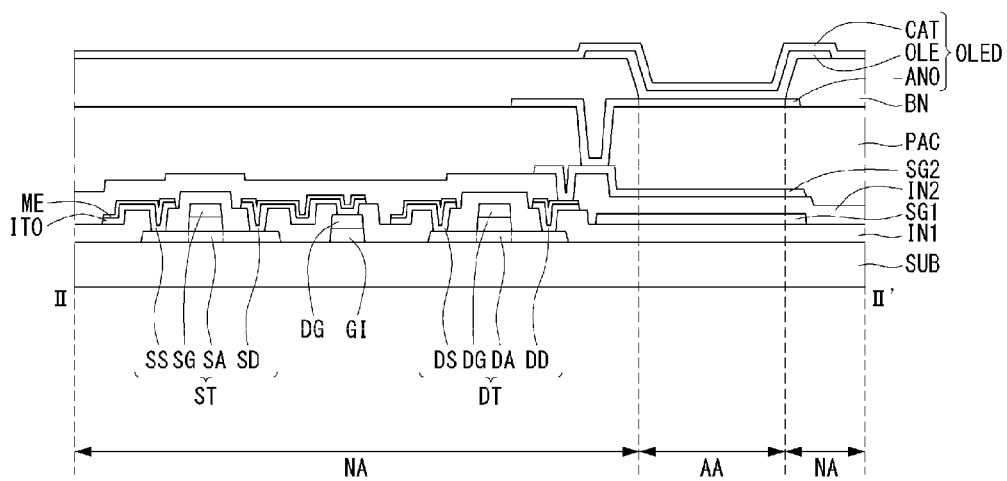
FIG. 6 is a plan view showing the structure of the organic light emitting diode display taken along line II-II' in FIG. 5.

Hereinafter, the first exemplary embodiment of the present disclosure will be described with reference to FIGS. 5 and 6. FIG. 5 is a plan view showing the structure of an organic light emitting diode display according to the first exemplary embodiment of the present disclosure. FIG. 6 is a plan view showing the structure of the organic light emitting diode display taken along line II-II' in FIG. 5.

Referring to FIGS. 5 and 6, the organic light emitting diode display according to the first exemplary embodiment of the present disclosure includes a substrate SUB in which an emission area AA and a non-emission area NA are defined, a switching TFT ST, a driving TFT DT connected to the switching TFT ST, a second storage capacitance electrode SG2 contacted with the driving TFT DT, an storage capacitance STG formed by overlapping the second storage capacitance electrode SG2 and a first storage capacitance electrode SG1 with each other, and an organic light emitting diode OLED connected to the driving TFT DT through the second storage capacitance electrode SG2. The storage capacitance STG and an organic light emitting diode OLED are formed in the emission area AA, and the TFTs ST and DT and lines SL, DL and VDD.

A scan line SL and a data line DL are formed in a matrix form on the substrate SUB to define a pixel. The switching TFT ST is formed in a region where the scan line SL and the data line DL intersect each other, to have a function of selecting a pixel. The switching TFT ST includes a switching gate electrode SG, a channel layer SA, a switching source electrode SS, and a switching drain electrode SD. The switching gate electrode SG is branched from the scan line SL, and the switching source electrode SS is branched from the data line DL.

The driving TFT DT includes a driving gate electrode DG, a channel layer DA, a driving source electrode DS, and a driving drain electrode DD. The driving gate electrode DG is connected to the switching drain electrode SD, and the driving source electrode DS is connected to a driving current line VDD.

A second insulation layer IN2 is formed which covers the source electrodes SS and DS and the drain electrodes SD and DD of the TFTs ST and DT and exposes a portion of the driving drain electrode DD. The second storage capacitance electrode SG2 is formed on the second insulation layer IN2 to be contacted with the portion of the driving drain electrode DD. In this state, the second storage capacitance electrode SG2 is overlapped with the first storage capacitance electrode SG1, which is formed together when the source electrodes SS and DS and the drain electrodes SD and DD of the TFTs ST and DT are formed, with the second insulation layer IN2 interposed therebetween, to form the storage capacitance STG.

The storage capacitance STG is formed by overlapping the second and first storage capacitance electrodes SG2 and SG1 formed of a transparent conductive material with each other, and thus can be formed in the emission area AA to have a wide area without any decrease in aperture ratio, thereby ensuring a sufficient storage capacitance.

An organic protective layer PAC exposing a portion of the second storage capacitance electrode SG2 is formed on the second storage capacitance electrode SG2. An anode electrode ANO is formed on the organic protective layer PAC to be contacted with the second storage capacitance electrode SG2. The anode electrode ANO is electrically connected to the drain electrode DD of the driving TFT DT through the second storage capacitance electrode SG2. A bank BN exposing a portion of the anode electrode ANO is formed on the anode electrode ANO. An organic light emitting layer OLE is formed on a portion of the bank BN and the exposed anode electrode ANO, and a cathode electrode CAT is formed on the organic light emitting layer OLE to cover the organic light emitting layer OLE. Accordingly, the organic light emitting diode OLED including the anode electrode ANO, the organic light emitting layer OLE and the cathode electrode CAT is completed.

Hereinafter, a process of manufacturing the organic light emitting diode display according to the first exemplary embodiment of the present disclosure will be described in detail with reference to FIGS. 7A to 7J. Through the manufacturing process, characteristics of the organic light emitting diode display according to the first exemplary embodiment of the present disclosure will be described in a more detailed manner. FIGS. 7A to 7J are views showing a method for manufacturing the organic light emitting diode display according to the first exemplary embodiment of the present disclosure.

Figure 7A:
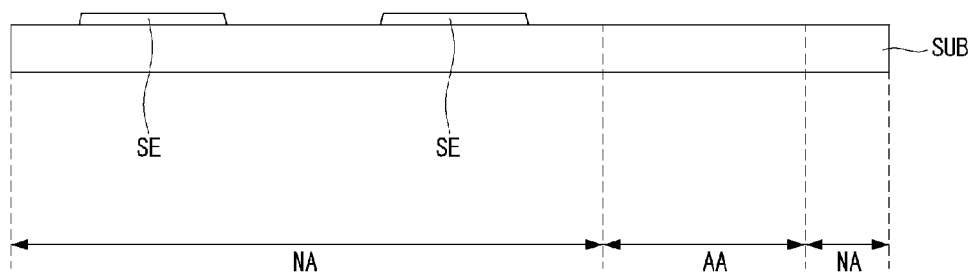

Referring to FIG. 7A, a semiconductor material is coated on the entire surface of a substrate SUB made of transparent glass or plastic. The semiconductor material may include an oxide semiconductor material such as indium Gallium zinc oxide (IGZO). The semiconductor material is patterned through a first mask process, to form semiconductor layers SE.

Figure 7B:
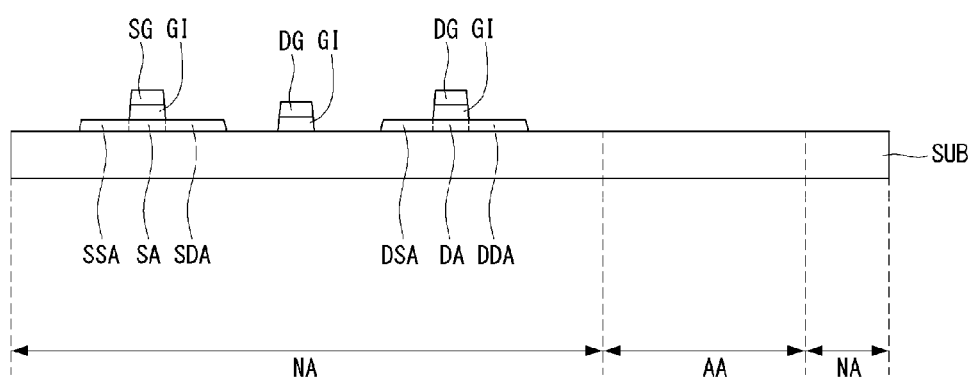

Referring to FIG. 7B, an insulation material and a metal material are sequentially coated on the entire surface of the substrate SUB having the semiconductor layers SE formed thereon. The insulation material and the metal material are patterned together through a second mask process, to form a gate insulation layer GI and gate electrodes SG and DG overlapped therewith. Preferably, the gate electrodes SG and DG are respectively overlapped with central regions of the semiconductor layers SE, and both sides of the semiconductor layers SE are exposed. The central regions of the semiconductor layers SE are respectively defined as a channel layer SA of a switching TFT ST and a channel layer DA of a driving TFT DT. The exposed semiconductor layers SE become source areas SSA and DSA and drain areas SDA and DDA respectively contacted with source and drain electrodes of the switching and driving TFTs. When the semiconductor material is an oxide semiconductor material, the source areas SSA and DSA and the drain areas SDA and DDA may have conductivity through a plasma treatment process.

Figure 7C:
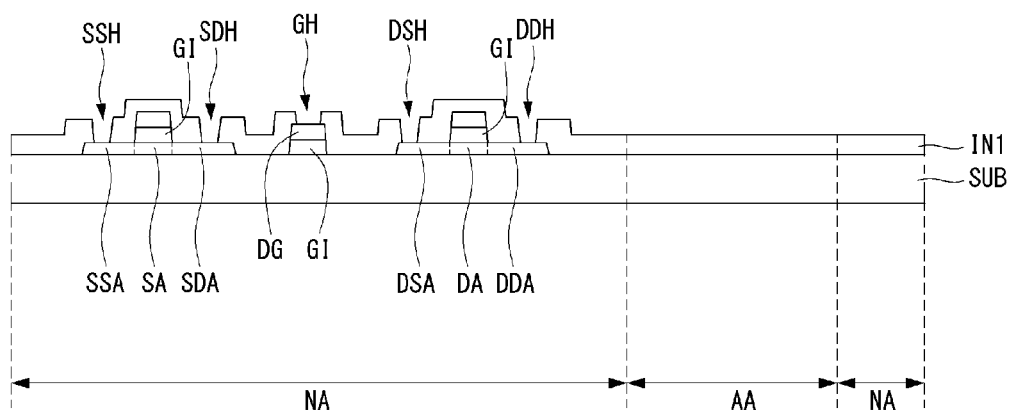

Referring to FIG. 7C, an insulation material is coated on the entire surface of the substrate SUB having the gate electrodes SG and DG formed thereon, thereby forming a first insulation layer IN1. The first insulation layer IN1 is patterned through a third mask process, to form contact holes SSH and DSH respectively exposing the source areas SSA and DSA of the semiconductor layers and contact holes respectively exposing the drain areas SDA and DDA of the semiconductor layers. In this state, a gate contact hole GH exposing a portion of the gate electrode DG of the driving TFT is also formed.

Figure 7D:
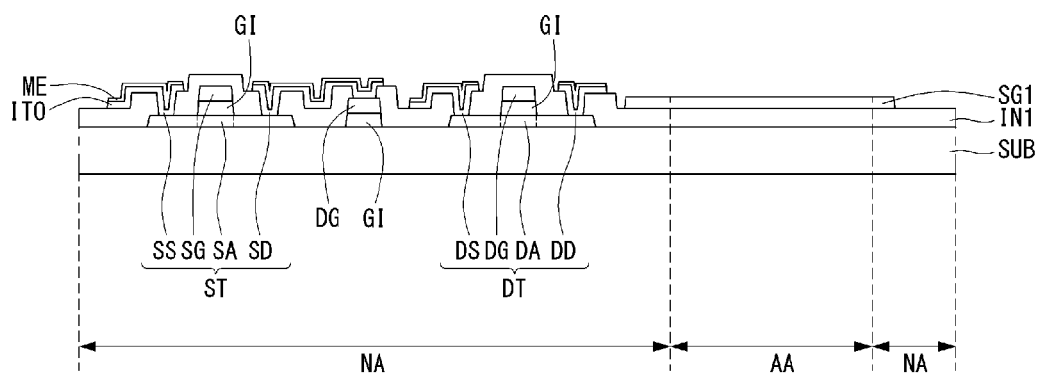

Referring to FIG. 7D, a transparent conductive material and a metal material are sequentially coated on the first insulation layer IN1 having the contact holes formed therein. The transparent conductive material may be a material such as indium tin oxide, indium zinc oxide, or indium tin zinc oxide. The transparent conductive material and the metal material are patterned through a fourth mask process, to form source and drain electrodes SS and SD of the switching TFT and source and drain electrodes DS and DD of the switching TFT. Meanwhile, a first storage capacitance electrode SG1 made of only the transparent conductive material is formed in an emission area AA. In this state, the drain electrode SD of the switching TFT is connected to the gate electrode DG of the driving TFT.

The fourth mask process is performed using a halftone mask. By using the halftone mask, each of the source and drain electrodes SS and SD of the switching TFT and the source and drain electrodes DS and DD of the driving TFT is formed as a double layer of the transparent conductive material and the metal material, and the first storage capacitance electrode SG1 is formed as a single layer including the transparent conductive material. Each of the source and drain electrodes SS and SD of the switching TFT and the source and drain electrodes DS and DD of the driving TFT may be formed as a single layer including the transparent conductive material. However, in consideration that the surface resistance of the transparent conductive material is high, each of the source and drain electrodes SS and SD of the switching TFT and the source and drain electrodes DS and DD of the driving TFT is preferably formed as a double layer formed by stacking the transparent conductive material and the metal material.

Figure 7E:
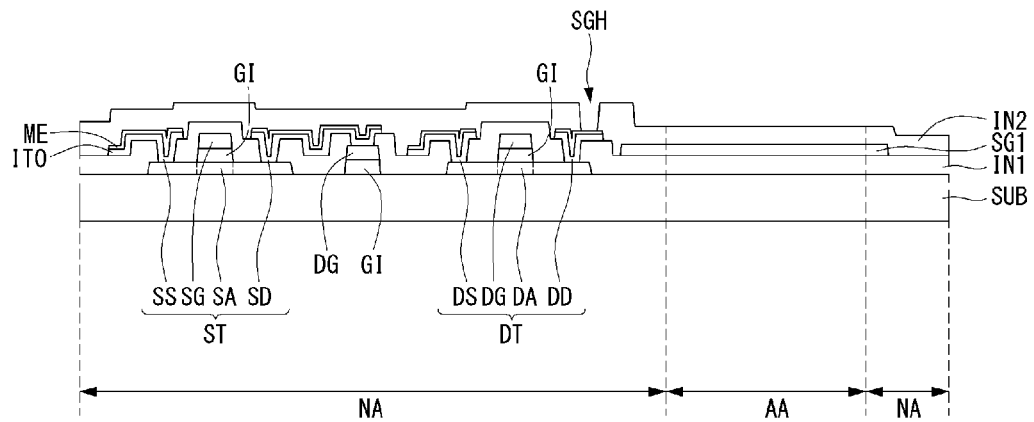

Referring to FIG. 7E, an insulation material is coated on the entire surface of the substrate SUB having the TFTs ST and DT formed thereon, thereby forming a second insulation layer IN2. The second insulation layer IN2 is patterned through a fifth mask process, to form a storage capacitance contact hole SGH.

Figure 7F:
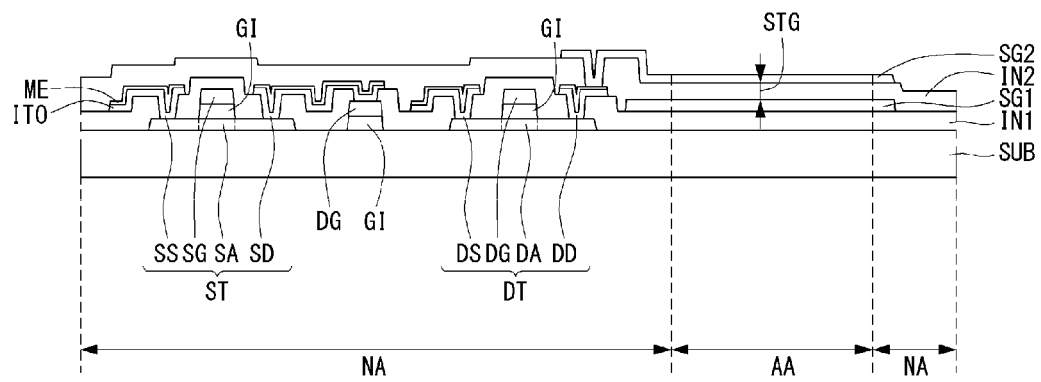

Referring to FIG. 7F, a transparent conductive material is coated on the entire surface of the substrate SUB having the storage capacitance contact hole SGH formed thereon. The transparent conductive material is patterned through a sixth mask process, to form a second storage capacitance electrode SG2. The second storage capacitance electrode SG2 is preferably formed to be overlapped with the first storage capacitance electrode SG1. The second storage capacitance electrode SG2 is contacted with the drain electrode DD of the driving TFT through the storage capacitance contact hole SGH.

In this state, the first and second storage capacitance electrodes SG1 and SG2 are formed to be overlapped with each other with the second insulation layer IN2 interposed therebetween in the emission area AA, and a storage capacitance STG is formed in the region where the first and second storage capacitance electrodes SG1 and SG2 are overlapped with each other. Thus, in the first exemplary embodiment of the present disclosure, the storage capacitance electrode is formed of a transparent conductive material, so that it is possible to form electrodes SG1 and SG2 in the entire emission area AA without any decrease in aperture ratio. Further, the storage capacitance having a wide area can be formed, so that it is possible to ensure a sufficient storage capacitance.

Figure 7G:
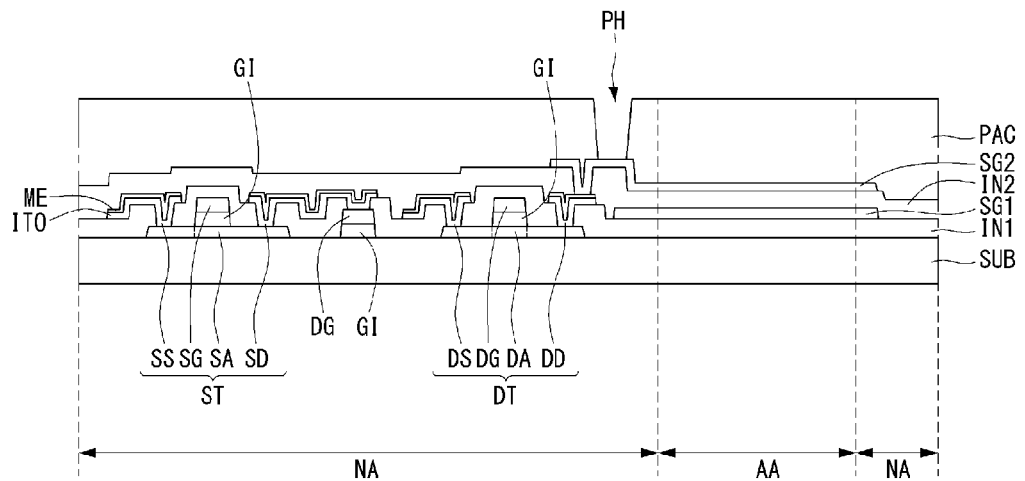

Referring to FIG. 7G, an insulation material is coated on the entire surface of the substrate SUB having the second storage capacitance electrode SG2, thereby forming an organic protective layer PAC. The organic protective layer PAC is patterned through a seventh mask process, to form a pixel contact hole PH.

Figure 7H:
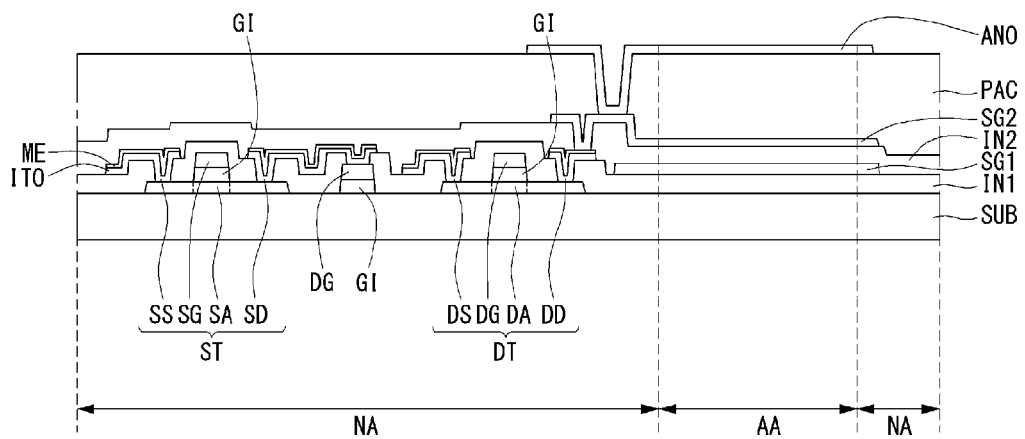

Referring to FIG. 7H, a transparent conductive material is coated on the entire surface of the substrate SUB having the pixel contact hole PH formed thereon. The transparent conductive material is patterned through an eighth mask process, to form an anode electrode ANO. The anode electrode ANO is contacted with the second storage capacitance electrode SG2 through the pixel contact hole PH. The anode electrode ANO is electrically connected to the drain electrode DD of the driving TFT through the second storage capacitance electrode SG2.

Referring to FIG. 7I, an insulation material is coated on the entire surface of the substrate SUB having the anode electrode ANO formed thereon. The insulation material is patterned through a ninth mask process, to form a bank BN. The bank BN defines an opening area to become an actual emission area. The bank BN preferably has a form for opening an area to emit light in the anode electrode ANO.

Referring to FIG. 7J, an organic light emitting material is coated on the entire surface of the substrate SUB having the bank BN formed thereon. The organic light emitting material is patterned through a tenth mask process, to form organic light emitting layers OLE of red, green and blue or organic light emitting layers OLE of red, green, blue and white. A metal material is coated on the entire surface of the substrate SUB having the organic light emitting layers OLE formed thereon, thereby forming a cathode electrode CAT. Accordingly, an organic light emitting diode OLED including the anode electrode ANO, the organic light emitting layers OLE and cathode electrode CAT is completed.

In the organic light emitting diode display according to the first exemplary embodiment of the present invention, the first and second storage capacitance electrodes SG1 and SG2 can be formed on the emission area AA to have a wide area without any decrease in aperture ratio, thereby ensuring a sufficient storage capacitance. As a result, when the driving TFT is in an off state, pixel data can be maintained, until a next period, using electric charges filled in the sufficiently ensured storage capacitance.

Features of the Second Exemplary Embodiment

The second exemplary embodiment of the present invention provides an organic light emitting diode display in which, when a storage capacitance using a transparent storage capacitance electrode is formed, unlike the first exemplary embodiment, the storage capacitance is formed without the mask process (FIG. 7F) for forming the second storage capacitance electrode SG2. However, when the second storage capacitance electrode is not formed, a storage capacitance is to be formed between the first storage capacitance electrode and the anode electrode. In this state, the organic protective layer formed between the first storage capacitance electrode and the anode electrode has a low dielectric constant and a thick thickness. Hence, it is difficult to form the storage capacitance. Thus, the second exemplary embodiment provides an organic light emitting diode display in which an organic protective layer formed in an emission area is removed, and the organic protective layer is formed in only a region where a driving element is formed, thereby forming a storage capacitance using a transparent storage capacitance electrode in the emission area.

Figure 8:
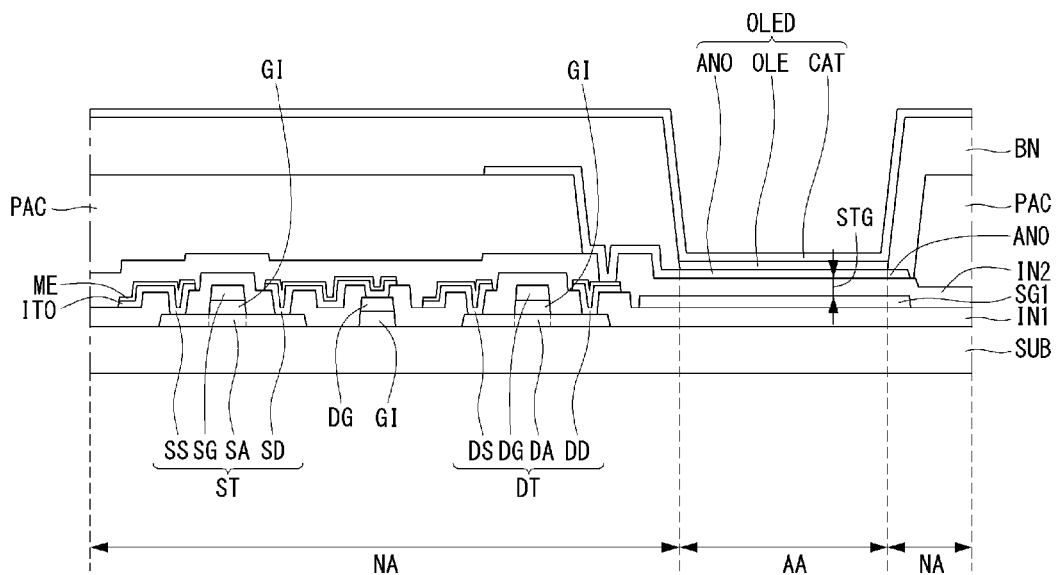
FIG. 8 is a sectional view showing the structure of an organic light emitting diode display according to a second exemplary embodiment of the present disclosure.

Hereinafter, referring to FIGS. 5 and 8, the second exemplary embodiment of the present invention will be described. FIG. 8 is a sectional view showing the structure of an organic light emitting diode display according to the second exemplary embodiment of the present invention.

Referring to FIGS. 5 and 8, the organic light emitting diode display according to the second exemplary embodiment of the present invention includes a substrate SUB in which an emission area AA and a non-emission area NA are defined, a switching TFT ST, a driving TFT DT connected to the switching TFT ST, an anode electrode ANO contacted with the driving TFT DT, and an storage capacitance STG formed by overlapping the anode electrode ANO and a first storage capacitance electrode SG1 with each other. The storage capacitance STG and an organic light emitting diode OLED are formed in the emission area AA, and the TFTs ST and DT and lines SL, DL and VDD.

A scan line and a data line are formed in a matrix form on the substrate SUB to define a pixel. The switching TFT ST is formed in a region where the scan line SL and the data line intersect each other, to have a function of selecting a pixel. The switching TFT ST includes a switching gate electrode SG, a channel layer SA, a switching source electrode SS, and a switching drain electrode SD. The switching gate electrode SG is branched from the scan line, and the switching source electrode SS is branched from the data line.

The driving TFT DT includes a driving gate electrode DG, a channel layer DA, a driving source electrode DS, and a driving drain electrode DD. The driving gate electrode DG is connected to the switching drain electrode SD, and the driving source electrode DS is connected to a driving current line VDD.

A second insulation layer IN2 is formed which covers the source electrodes SS and DS and the drain electrodes SD and DD of the TFTs ST and DT and exposes a portion of the driving drain electrode DD. An organic protective layer PAC exposing a portion of the driving drain electrode DD and the emission area AA is formed on the second insulation layer IN2.

The anode electrode ANO is formed on the organic protective layer PAC to be contacted with the driving drain electrode DD. In this state, the anode electrode ANO is overlapped with the first storage capacitance electrode SG1, which is formed together when the source electrodes SS and DS and the drain electrodes SD and DD of the TFTs ST and DT are formed, with the second insulation layer IN2 interposed therebetween, to form the storage capacitance STG.

The storage capacitance STG is formed by overlapping the anode electrode ANO formed of a transparent conductive material and the first storage capacitance electrode SG1 with each other, and thus can be formed in the emission area AA to have a wide area without any decrease in aperture ratio, thereby ensuring a sufficient storage capacitance. The anode ANO functions both as the anode for the OLED as well as for one of the electrodes for the storage capacitance STG in this embodiment of FIG. 8.

A bank BN exposing a portion of the anode electrode ANO is formed on the anode electrode ANO. An organic light emitting layer OLE is formed on a portion of the bank BN and the exposed anode electrode ANO, and a cathode electrode CAT is formed on the organic light emitting layer OLE to cover the organic light emitting layer OLE. Accordingly, the organic light emitting diode OLED including the anode electrode ANO, the organic light emitting layer OLE and the cathode electrode CAT is completed.

Hereinafter, a process of manufacturing the organic light emitting diode display according to the second exemplary embodiment of the present invention will be described in detail with reference to FIGS. 9A to 9H. Through the manufacturing process, characteristics of the organic light emitting diode display according to the second exemplary embodiment of the present invention will be described in a more detailed manner. FIGS. 9A to 9H are views showing a method for manufacturing the organic light emitting diode display according to the second exemplary embodiment of the present invention.

Figure 9A:
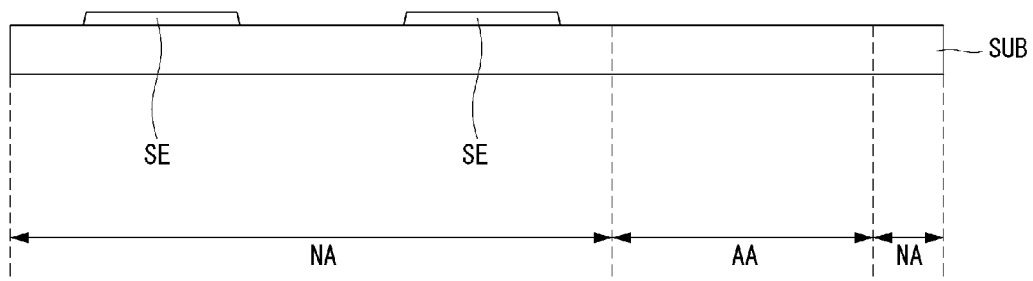
FIGS. 9A to 9H are views showing a method for manufacturing the organic light emitting diode display according to the second exemplary embodiment of the present disclosure.

Referring to FIG. 9A, a semiconductor material is coated on the entire surface of a substrate SUB made of transparent glass or plastic. The semiconductor material may include an oxide semiconductor material such as IGZO. The semiconductor material is patterned through a first mask process, to form semiconductor layers SE.

Figure 9B:
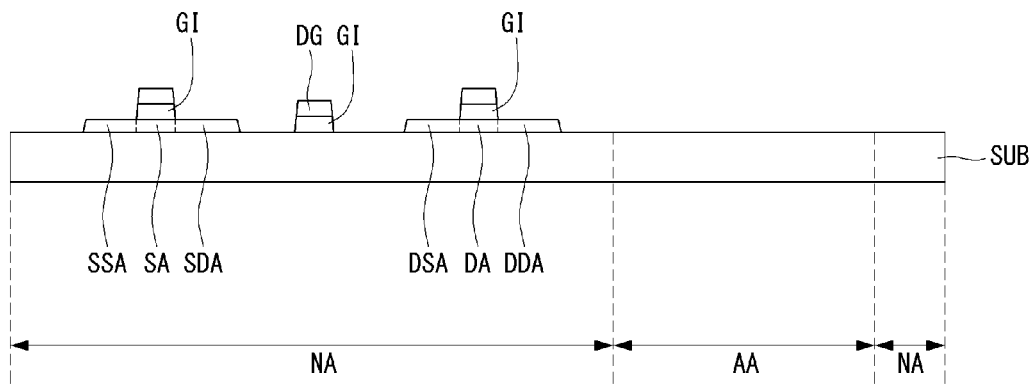

Referring to FIG. 9B, an insulation material and a metal material are sequentially coated on the entire surface of the substrate SUB having the semiconductor layers SE formed thereon. The insulation material and the metal material are patterned together through a second mask process, to form a gate insulation layer GI and gate electrodes SG and DG overlapped therewith. Preferably, the gate electrodes SG and DG are respectively overlapped with central regions of the semiconductor layers SE, and both sides of the semiconductor layers SE are exposed. The central regions of the semiconductor layers SE are respectively defined as a channel layer SA of a switching TFT ST and a channel layer DA of a driving TFT DT. The exposed semiconductor layers SE become source areas SSA and DSA and drain areas SDA and DDA respectively contacted with source and drain electrodes of the switching and driving TFTs. When the semiconductor material is an oxide semiconductor material, the source areas SSA and DSA and the drain areas SDA and DDA may have conductivity through a plasma treatment process.

Figure 9C:
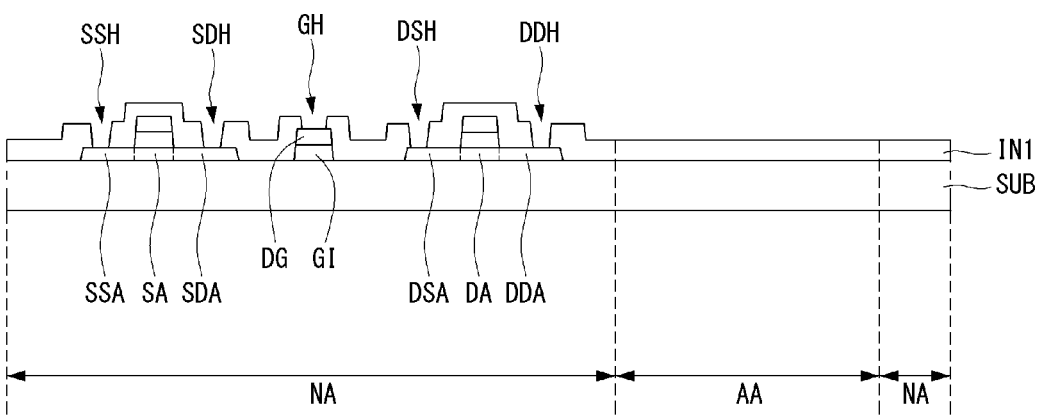

Referring to FIG. 9C, an insulation material is coated on the entire surface of the substrate SUB having the gate electrodes SG and DG formed thereon, thereby forming a first insulation layer IN1. The first insulation layer IN1 is patterned through a third mask process, to form contact holes SSH and DSH respectively exposing the source areas SSA and DSA of the semiconductor layers and contact holes respectively exposing the drain areas SDA and DDA of the semiconductor layers. In this state, a gate contact hole GH exposing a portion of the gate electrode DG of the driving TFT is also formed.

Figure 9D:
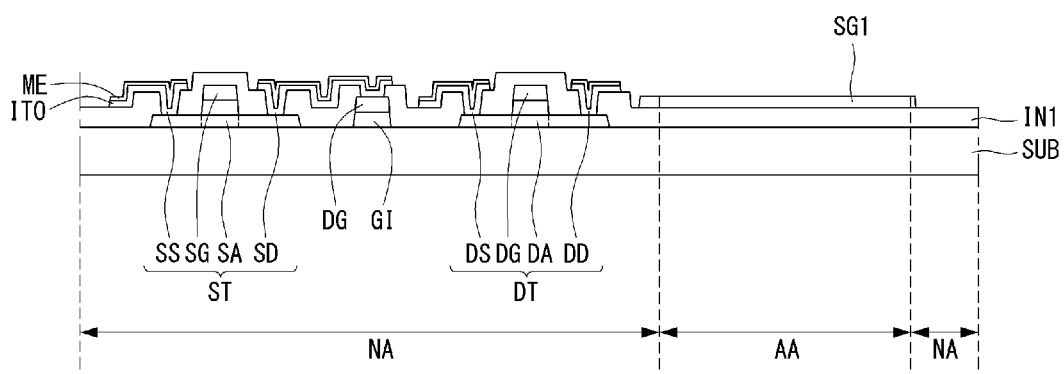

Referring to FIG. 9D, a transparent conductive material and a metal material are sequentially coated on the first insulation layer IN1 having the contact holes formed therein. The transparent conductive material may be a material such as indium tin oxide, indium zinc oxide, or indium tin zinc oxide. The transparent conductive material and the metal material are patterned through a fourth mask process, to form source and drain electrodes SS and SD of the switching TFT and source and drain electrodes DS and DD of the switching TFT. Meanwhile, a first storage capacitance electrode SG1 made of only the transparent conductive material is formed in an emission area AA. In this state, the drain electrode SD of the switching TFT is connected to the gate electrode DG of the driving TFT.

The fourth mask process is performed using a halftone mask. By using the halftone mask, each of the source and drain electrodes SS and SD of the switching TFT and the source and drain electrodes DS and DD of the driving TFT is formed as a double layer of the transparent conductive material and the metal material, and the first storage capacitance electrode SG1 is formed as a single layer including the transparent conductive material. Each of the source and drain electrodes SS and SD of the switching TFT and the source and drain electrodes DS and DD of the driving TFT may be formed as a single layer including the transparent conductive material. However, in consideration that the surface resistance of the transparent conductive material is high, each of the source and drain electrodes SS and SD of the switching TFT and the source and drain electrodes DS and DD of the driving TFT is preferably formed as a double layer formed by stacking the transparent conductive material and the metal material.

Figure 9E:
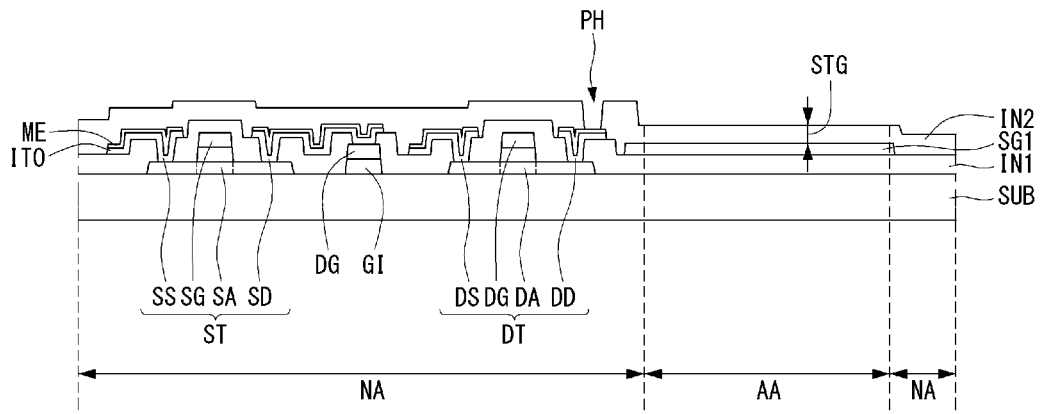

Referring to FIG. 9E, an insulation material is coated on the entire surface of the substrate SUB having the TFTs ST and DT formed thereon, thereby forming a second insulation layer IN2. The second insulation layer IN2 is patterned through a fifth mask process, to form a pixel contact hole PH.

Figure 9F:
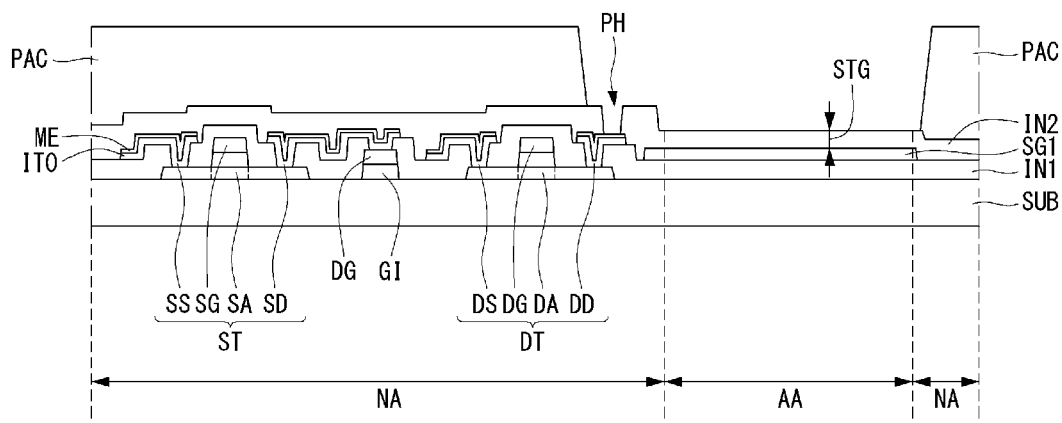

Referring to FIG. 9F, an insulation material is coated on the entire surface of the substrate SUB having the pixel contact hole PH formed thereon, thereby forming an organic protective layer PAC. The organic protective layer PAC is patterned through a sixth mask process, to expose the pixel contact hole PH and the second insulation layer IN2 in the emission area AA.

Figure 9G:
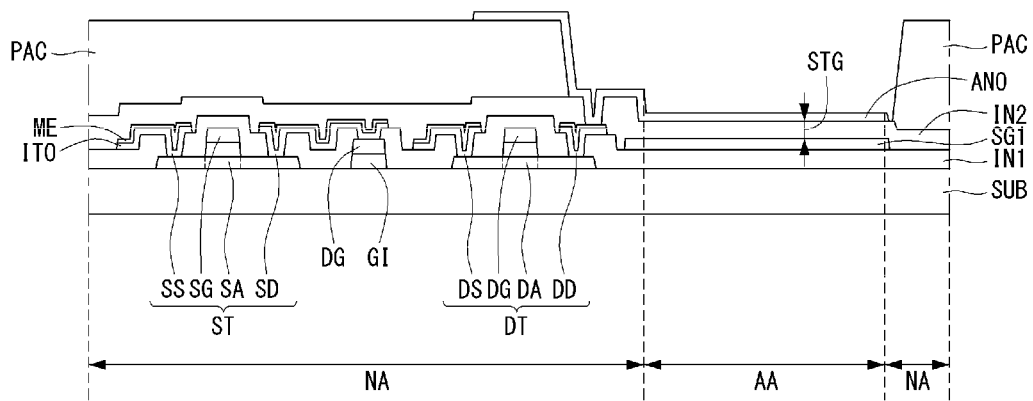

Referring to FIG. 9G, a transparent conductive material is coated on the substrate SUB having the organic protective layer PAC formed thereon. The transparent conductive material is patterned through a seventh mask process, to form an anode electrode ANO. The anode electrode ANO is contacted with the drain electrode DD of the driving TFT through the pixel contact hole PH.

In this state, the first storage capacitance electrode SG1 and the anode electrode ANO are formed to be overlapped with each other with the second insulation layer IN2 interposed therebetween in the emission area AA, and a storage capacitance STG is formed in the region where the first storage capacitance electrode SG1 and the anode electrode ANO are overlapped with each other. Thus, in the second exemplary embodiment of the present disclosure, the storage capacitance electrode is formed of a transparent conductive material, so that it is possible to form electrodes in the entire emission area without any decrease in aperture ratio. Further, the storage capacitance having a wide area can be formed, so that it is possible to ensure a sufficient storage capacitance.

Figure 9H:
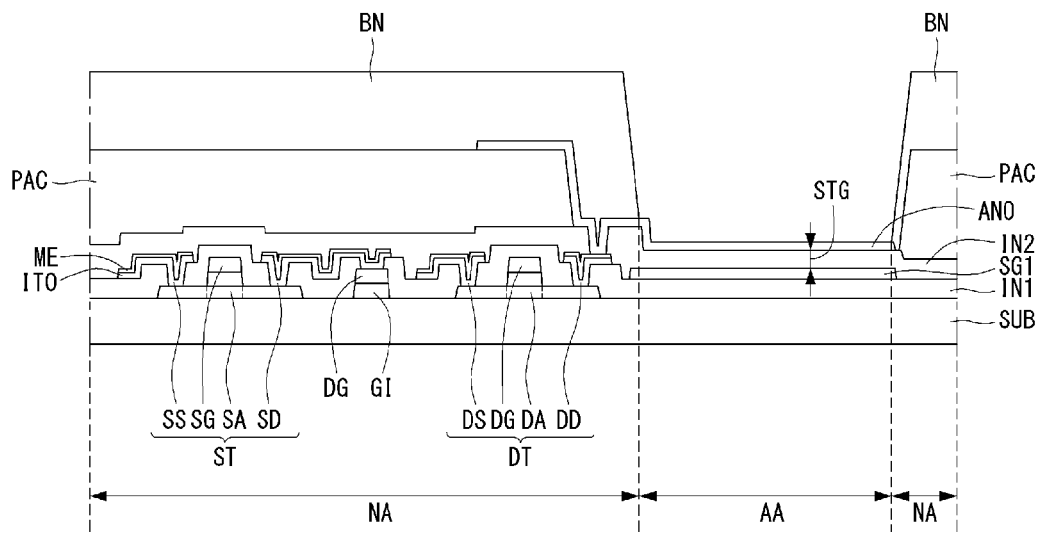

Referring to FIG. 9H, an insulation material is coated on the entire surface of the substrate SUB having the anode electrode ANO formed thereon. The insulation material is patterned through an eighth mask process, to form a bank BN. The bank BN defines an opening area to become an actual emission area. The bank BN preferably has a form for opening an area to emit light in the anode electrode ANO.

After that, like mentioned in first exemplary embodiment, the OLED is formed by stacking organic light emitting layer OLE and cathode electrode CAT, as shown in FIG. 8. In the method for manufacturing the organic light emitting diode display according to the second exemplary embodiment of the present invention, the number of mask processes is decreased as compare with that in the first exemplary embodiment. In the second exemplary embodiment, the process of forming the second storage capacitance electrode SG2, described in the manufacturing process of the first exemplary embodiment is omitted. Accordingly, in the second exemplary embodiment, it is possible to decrease a manufacturing space and tact time for the process and to reduce process cost.

In the method for manufacturing the organic light emitting diode display according to the second exemplary embodiment of the present invention, the first storage capacitance electrode SG1 can be formed on the emission area AA to have a wide area without any decrease in aperture ratio, thereby ensuring a sufficient storage capacitance. As a result, when the driving TFT is in an off state, pixel data can be maintained, until a next period, using electric charges filled in the sufficiently ensured storage capacitance.

Features of the Third Exemplary Embodiment

Unlike the second exemplary embodiment, the third exemplary embodiment of the present invention provides an organic light emitting diode display in which only a portion of an organic protective layer PAC is removed in an emission area, so that it is possible to minimize the parasitic capacitance between a data line and an anode electrode and to ensure an storage capacitance sufficient in driving a driving TFT.

Specifically, the organic protective layer PAC is an organic insulation layer formed to reduce a signal transmission distortion phenomenon of a magnetic field generated between the data line and the anode electrode. In consideration of the area occupied by the organic protective layer in order to perform the function of the organic protective layer and the area of a storage capacitance in order to ensure the storage capacitance sufficient in driving the driving TFT, the organic protective layer PAC may be formed in only a portion of the emission area.

Figure 10:
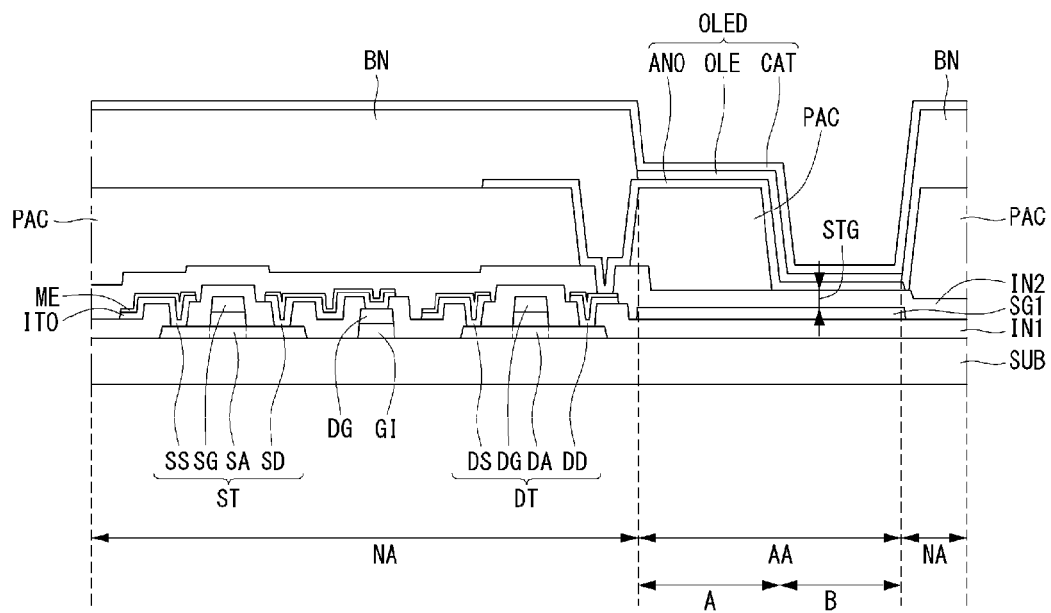
FIG. 10 is a sectional view showing the structure of an organic light emitting diode display according to a third exemplary embodiment of the present disclosure.

In the third exemplary embodiment of the present invention, the process until before the organic protective layer is formed is substantially identical to that in the second exemplary embodiment. FIG. 10 is a sectional view showing the structure of an organic light emitting diode display according to the third exemplary embodiment of the present invention.

Referring to FIG. 10, an insulation material is coated on a surface of a second insulation layer IN2 having a pixel contact hole PH formed therein, thereby forming an organic protective layer PAC. The organic protective layer PAC is patterned through a sixth mask process, to expose the pixel contact hole PH and the second insulation layer IN2 in a portion B of an emission area AA. A transparent conductive material is coated on the entire surface of a substrate SUB having the organic protective layer PAC formed thereon. The transparent conductive material is patterned through a seventh mask process, to form an anode electrode ANO. The anode electrode ANO is contacted with a drain electrode DD of a driving TFT through the pixel contact hole PH.

In this state, a first storage capacitance electrode SG1 and the anode electrode ANO are formed to be overlapped with each other with a second insulation layer IN2 interposed therebetween in the region B where the organic protective layer PAC is not formed in the emission area AA, and a storage capacitance STG is formed in the region where the first storage capacitance electrode SG1 and the anode electrode ANO are overlapped with each other. Thus, in the third exemplary embodiment of the present invention, the storage capacitance electrode is formed of a transparent conductive material, so that it is possible to form electrodes in a portion of the emission area AA without any decrease in aperture ratio. Further, the storage capacitance having a wide area can be formed, so that it is possible to ensure a sufficient storage capacitance.

An insulation material is coated on the entire surface of the substrate SUB having the anode electrode ANO formed thereon. The insulation material is patterned through an eighth mask process, to form a bank BN. The bank BN defines an opening area to become an actual emission area. The bank BN preferably has a form for opening an area to emit light in the anode electrode ANO.

An organic light emitting layer OLE is formed on a portion of the bank BN and the exposed anode electrode ANO, and a cathode electrode CAT is formed on the organic light emitting layer OLE to cover the organic light emitting layer OLE. Accordingly, the organic light emitting diode OLED including the anode electrode ANO, the organic light emitting layer OLE and the cathode electrode CAT is completed.

In the third exemplary embodiment of the present invention, an aperture ratio may be reduced, because a black region is generated by a step coverage of the organic protective layer. Meanwhile, in an organic light emitting diode display, whole one pixel cannot be used, when anode electrodes are shorted to cathode electrodes. As method for solving this problem, a repair pattern structure in which one pixel is divided into two regions can be applied. The repair pattern structure includes a bank which is disposed between two regions, to divide one pixel into two regions. But a region where the bank is disposed becomes a black region. Thus, when the portion at which the step coverage of the organic protective layer is formed overlaps the portion at which the bank is additionally formed, the repair pattern structure and the structure of the third exemplary embodiment of the present disclosure can be simultaneously implemented without substantially reducing aperture ratio according to the third exemplary embodiment of the present disclosure.

Like the second exemplary embodiment, in a method for manufacturing the organic light emitting diode display according to the third exemplary embodiment of the present disclosure, the number of mask processes is decreased as compare with that in the first exemplary embodiment. That is, in the third exemplary embodiment, the process of forming the second storage capacitance electrode SG2 (FIG. 7F) is omitted as compared with the first exemplary embodiment. Accordingly, in the third exemplary embodiment, it is possible to decrease a manufacturing space and tact time for the process and to reduce process cost.

In the method for manufacturing the organic light emitting diode display according to the third exemplary embodiment of the present invention, the first storage capacitance electrode SG1 can be formed on a portion of the emission area AA to have a wide area, thereby ensuring a sufficient storage capacitance. As a result, when the driving TFT is in an off state, pixel data can be maintained, until a next period, using electric charges filled in the sufficiently ensured storage capacitance.

Features of the Fourth Exemplary Embodiment

When necessary, different structures of the organic protective layer may be formed in sub-pixels, respectively. For example, the structure as shown in the second exemplary embodiment may be used in a red sub-pixel, the structure as shown in the third exemplary embodiment may be used in a green sub-pixel, and the like. As such, the organic protective layers of the sub-pixels may be formed into different structures according to a designer's intention.

Among exemplary embodiments of the present disclosure, particularly in the organic light emitting diode displays according to the second and third exemplary embodiments that are preferred exemplary embodiments, the emission efficiency increases due to constructive/destructive interference of light between the anode electrode ANO and the first storage capacitance SG1. That is, in the second and third exemplary embodiments, the first insulation layer IN1 (low refractive index layer), the first storage capacitance electrode SG1 (high refractive index layer), the second insulation layer IN2 (low refractive index layer) and the anode electrode ANO (high refractive index layer) are sequentially laminated, so that it is possible to improve emission efficiency and color purity through light amplification (micro-cavity) caused by resonance between the layers. Thus, it is possible to provide an organic light emitting diode display having an increased color gamut and an increased luminance.

Hereinafter, changes in color gamut in the organic light emitting diode displays according to the second and third exemplary embodiments of the present invention will be described with reference to Table 1 and FIG. 11.

Table 1 shows optical simulation results of the second and third exemplary embodiments, under a measurement condition in which the first storage capacitance electrode has a thickness of 400 Å, and the second insulation layer has a thickness of 2500 Å.

FIG. 11 is a graph showing color coordinates according to results of Table 1.

TABLE 1

|  |  | CIE_x | CIE_y | Color gamut (BT709) |
|---|---|---|---|---|
| All_PAC structure | R | 0.646 | 0.353 | 70.9% |
|  | G | 0.319 | 0.634 |  |
|  | B | 0.140 | 0.129 |  |
|  | W | 0.281 | 0.289 |  |
| Exemplary embodiment 2 (e.g., FIG. 8) | R | 0.652 | 0.347 | 89.3% |
|  | G | 0.278 | 0.654 |  |
|  | B | 0.140 | 0.097 |  |
|  | W | 0.281 | 0.289 |  |
| Exemplary embodiment 3 (e.g., FIG. 10) | R | 0.649 | 0.350 | 79.5% |
|  | G | 0.298 | 0.644 |  |
|  | B | 0.140 | 0.113 |  |
|  | W | 0.281 | 0.289 |  |

Referring to Table 1 and FIG. 11, it can be seen that, in the second exemplary embodiment in which the organic protective layer is removed in the emission area, the color gamut remarkably increases as compared with the structure in which the organic protective layer is formed in the entire emission area. In addition, it can be seen that, in the third exemplary embodiment in which the organic protective layer is removed in only a portion of the emission area, the color gamut decreases as compared with that the second exemplary embodiment, but increases as compared with the structure in which the organic protective layer is formed in the entire emission area.

That is, it can be seen that the color gamuts by the light amplification in the second exemplary embodiment (e.g., FIG. 8) and third exemplary embodiment (e.g. FIG. 10) are respectively 89.3% and 79.5%, which are remarkably increased as compared with the structure in which the organic protective layer is formed in the entire emission area.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode (OLED) display comprising:
    a substrate in which an emission area and a non-emission area are defined;
    an OLED disposed in the emission area;
    a thin film transistor disposed in the non-emission area;

a first insulation layer overlapping the thin film transistor in the non-emission area;

a first storage capacitance electrode disposed in the emission area on the first insulation layer;

a second insulation layer disposed to cover the first storage capacitance electrode and the thin film transistor except a portion of the thin film transistor, said portion of the thin film transistor being exposed through the second insulation layer;

an organic protective layer disposed on the second insulation layer and overlapping with the thin film transistor except where said portion of the thin film transistor is exposed through the second insulation layer; and an anode electrode of the OLED disposed on the second insulation layer, the anode electrode electrically connected to the thin film transistor, wherein the anode electrode and the first storage capacitance electrode are overlapped with each other with the second insulation layer interposed therebetween in the emission area to form a storage capacitor.

2. The organic light emitting diode display of claim 1, wherein the organic protective layer does not overlap a portion of the second insulation layer in the emission area such that the portion of the second insulation layer in the emission area is exposed through the organic protective layer.

3. The organic light emitting diode display of claim 1, wherein the first storage capacitance electrode is formed of a transparent conductive material including at least one of indium tin oxide (ITO), indium zinc oxide (IZO) and indium tin zinc oxide (ITZO).

4. The organic light emitting diode display of claim 1, wherein the anode electrode is formed of a transparent conductive material including at least one of ITO, IZO and ITZO.

5. An organic light emitting diode (OLED) display comprising:

a substrate including an emission area and a non-emission area;

a thin film transistor formed in the non-emission area;

an OLED formed in the emission area; and a storage capacitor coupled between a gate electrode and one of a source electrode and a drain electrode of the thin film transistor, the storage capacitor formed in at least a part of the emission area to overlap with a part of the OLED in a direction in which light is emitted by the OLED.

6. The OLED display of claim 5, wherein: the storage capacitor includes a first storage electrode, a second storage electrode, and an insulation layer formed between the first storage electrode and the second storage electrode; and the OLED includes a cathode, an anode, and an organic light emitting layer formed between the cathode and the anode, both the cathode and the anode being a distinct layer separate from the first storage electrode and the second storage electrode, wherein the first and second storage electrodes are electrically conductive and substantially transparent to a wavelength of light emitted by the OLED.

7. The OLED display of claim 5, wherein the first storage electrode and the second storage electrodes are formed of a transparent conductive material including at least one of indium tin oxide (ITO), indium zinc oxide (IZO), and indium tin zinc oxide (ITZO).

8. The OLED display of claim 5, further comprising:

an organic protective layer separating the storage capacitor from the OLED in substantially the entire emission area, the organic protective layer including an organic insulating material.

9. The OLED display of claim 5, wherein:

the OLED includes a cathode, an anode, and an organic light emitting layer formed between the cathode and the anode; and the storage capacitor includes a first storage electrode, the anode, and an insulation layer formed between the first storage electrode and the anode, the anode functioning as a second electrode of the storage capacitor.

10. The OLED display of claim 9, wherein a bank layer is absent between the anode and the insulation layer in the emission area.

11. The OLED display of claim 9, wherein a bank layer is formed between the anode and the insulation layer in at least a part of the emission area in a vicinity of the thin film transistor.

12. The OLED display of claim 9, wherein:

the anode electrode and the first storage electrode are formed of a transparent conductive material including at least one of indium tin oxide (ITO), indium zinc oxide (IZO), and indium tin zinc oxide (ITZO).

* * * * *